United States Patent
Chou et al.

(10) Patent No.: US 7,385,333 B2
(45) Date of Patent: Jun. 10, 2008

(54) PIEZOELECTRIC POWER SUPPLY

(75) Inventors: Chin-Wen Chou, Taipei Hsien (TW);
Ying-Nan Cheng, Taipei Hsien (TW)

(73) Assignee: Zippy Technology Corp., Hsin-Tien, Taipei (TW)

( * ) Notice: Subject to any disclaimer, the term of this patent is extended or adjusted under 35 U.S.C. 154(b) by 0 days.

(21) Appl. No.: 11/508,210

(22) Filed: Aug. 23, 2006

(65) Prior Publication Data

US 2008/0048524 A1  Feb. 28, 2008

(51) Int. Cl.
*H01L 41/107* (2006.01)
(52) U.S. Cl. .................................... 310/318
(58) Field of Classification Search ................. 310/318
See application file for complete search history.

(56) References Cited

U.S. PATENT DOCUMENTS

| | | | | |
|---|---|---|---|---|
| 5,892,318 | A * | 4/1999 | Dai et al. .................. | 310/358 |
| 6,182,340 | B1 * | 2/2001 | Bishop ...................... | 29/25.35 |
| 6,960,871 | B1 * | 11/2005 | Kumasaka et al. ......... | 310/359 |
| 7,019,993 | B2 * | 3/2006 | Vazquez Carazo .......... | 363/67 |
| 7,075,217 | B2 * | 7/2006 | Vazquez Carazo ......... | 310/359 |
| 7,095,158 | B2 * | 8/2006 | Yun-Xiu et al. ............ | 310/318 |
| 2003/0234762 | A1 * | 12/2003 | Nakatsuka et al. ......... | 345/102 |
| 2004/0222718 | A1 * | 11/2004 | Fujimura et al. ........... | 310/318 |

FOREIGN PATENT DOCUMENTS

| | | | |
|---|---|---|---|
| JP | 4-244509 | * | 9/1992 |
| JP | 10-144977 | * | 5/1998 |
| TW | 200534569 A | | 10/2005 |

* cited by examiner

*Primary Examiner*—Thomas M. Dougherty
(74) *Attorney, Agent, or Firm*—Muncy, Geissler, Olds & Lowe, PLLC

(57) ABSTRACT

A piezoelectric power supply includes a power supply unit to provide DC intermediate voltage power output to drive a high voltage output unit of a first load through a first piezoelectric plate and a low voltage output unit of a second load through a second piezoelectric plate. Thereby the power supply can provide a low voltage secondary power output to reduce cost and improve power output flexibility and efficiency. It can be used on display devices such as gas discharge lamps, and also provide additional low voltage secondary power for peripheral devices such as speakers, lamps, ear sets, USB connection ports and the like.

11 Claims, 3 Drawing Sheets

PIEZOELECTRIC POWER SUPPLY

FIELD OF THE INVENTION

The present invention relates to a power supply and particularly to a piezoelectric power supply.

BACKGROUND OF THE INVENTION

In recent years LCD technology has been well developed, the cost of LCD drops significantly. As a result, it gradually replaces the traditional CRT in the home appliances. The competition in the market place is fierce. To provide distinguished product features is a high priority R & D issue in the LCD market. For instance, R.O.C. patent publication No. 200534569 discloses two types of driving circuits. The first type of driving circuit provides an AC signal from a power source to a power supply, then the power supply transforms voltage to output an electric signal to an inverter to boost the voltage and output a high voltage electric signal. The present power supply to process the AC signal output from the power source includes an electromagnetic interference (EMI) filter unit, a commutation unit, a power factor corrector and a conversion unit. The EMI filter unit and commutation unit receive the AC signal to perform filtering and commutation processes and output a full wave/half wave DC signal, then the power factor corrector receives the full wave/half wave DC signal and performs power factor correction to output an electric signal to the conversion unit (DC-DC) which transforms voltage to output a low voltage signal to the inverter. The inverter boosts the voltage to become a high voltage electric signal to be sent to a load linking to a rear end.

Another type of driving circuit differs from the previous circuit as follow: the AC signal output from the power source is received by the EMI filter unit and commutation unit for filtering and commutation processes, and becomes a full wave/half wave DC signal to be output. The full wave/half wave DC signal is an intermediate voltage electric signal (such as the power source being 100V, the full wave/half wave DC signal being 150V). The intermediate voltage electric signal is sent to an inverter for voltage boosting to become a high voltage electric signal to be output to a load.

When the conventional driving circuits mentioned above are adopted on a flat panel display device, only the high voltage electric signal is provided to the load (namely a cold cathode fluorescent lamp CCFL). As a result, no extra connection ports are added to the present display devices on the market. Users have to couple required peripheral devices by themselves, such as speakers, small lamps, ear sets, USB connection ports, or small 3C products sensible to screen images to generate interactions. Another approach is to provide a low voltage power cord and a mating low voltage driving circuit to support the LCD screen of the peripheral devices. All the aforesaid approaches result in a higher cost and a longer production process. They create a greater burden to manufacturers and consumers.

A power supply capable of providing high voltage output power and low voltage power to be used on display devices not only can reduce the cost and production process, also increase utilization efficiency and flexibility, and enhance competitiveness on the market.

SUMMARY OF THE INVENTION

Therefore the primary object of the present invention is to provide a piezoelectric power supply that has a high voltage output unit to supply power required by a high voltage load such as a gas discharge lamp through a first piezoelectric plate and a low voltage output unit to supply power required by peripheral devices such as speakers, small lamps, ear sets, USB connection ports and the like through a second piezoelectric plate. Thereby cost and production process can be reduced, and more LCD features can be provided to improve product competitiveness.

The piezoelectric power supply of the invention provides lower voltage power and high voltage power. The power supply equipped with the piezoelectric plate to provide the low voltage power includes a power supply unit to provide DC intermediate power output, a high voltage output unit to transform the power output from the power supply unit through a first piezoelectric plate to AC high voltage power to be output, and a lower voltage output unit which transforms the power output from the power supply unit through a second piezoelectric plate to AC low voltage power to be output.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
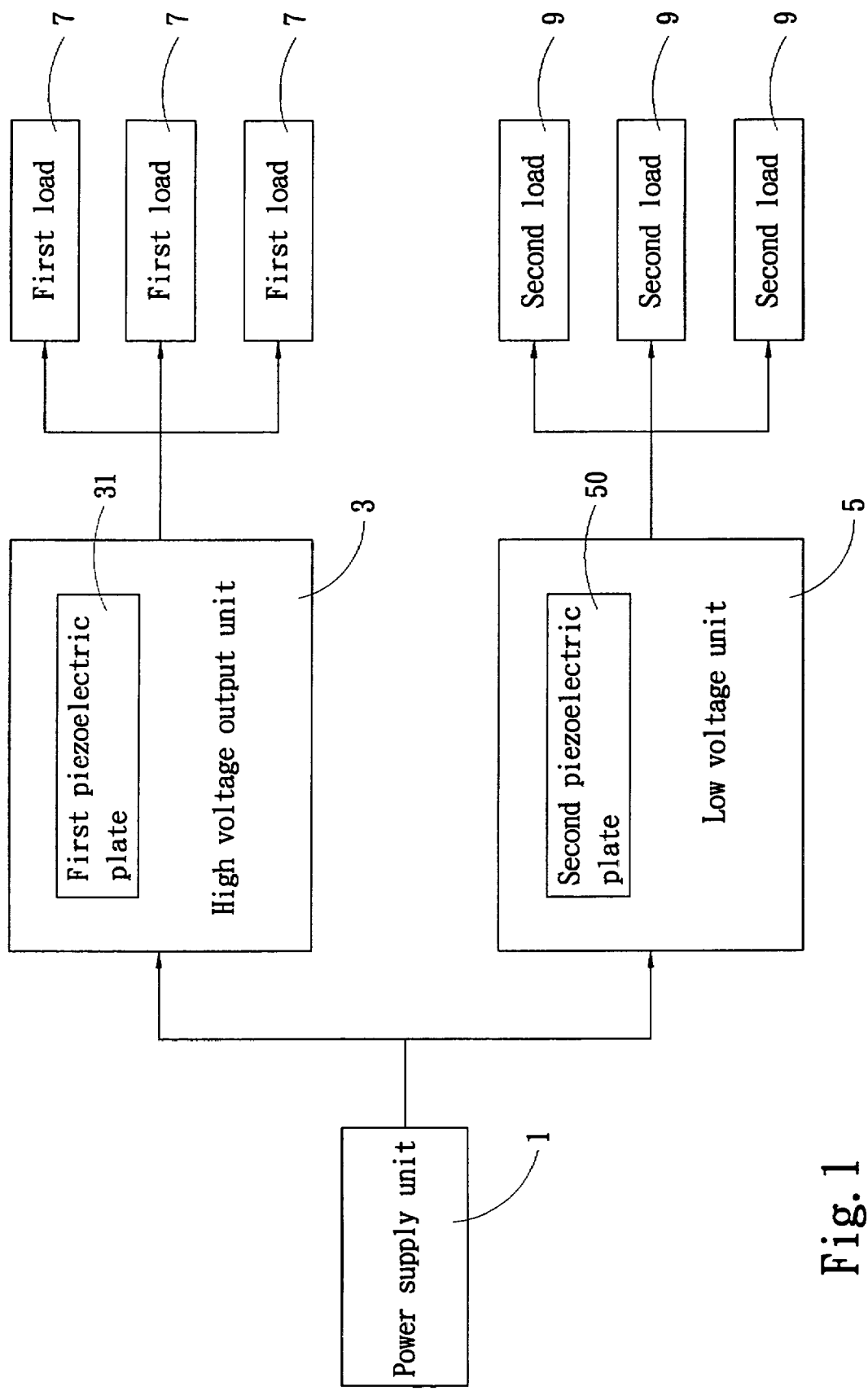
FIG. 1 is an architecture block diagram of a first embodiment of the invention.

Please refer to FIG. 1 for an architecture block diagram of a first embodiment of the invention. The piezoelectric power supply of the invention aims to provide a low voltage power and a high voltage power. It includes a power supply unit 1 to receive city AC power and transform to DC intermediate voltage power to be output, a high voltage output unit 3 which has a first piezoelectric plate 31 to transform the power output from the power supply unit 1 to AC high voltage power to output and supply at least one first load 7, and a low voltage output unit 5 which has a second piezoelectric plate 50 to transform the power output from the power supply unit 1 to AC low voltage power to output and supply at least one second load 9. The first piezoelectric plate 31 and the second piezoelectric plate 50 may be laminated piezoelectric plates or a single piezoelectric plate.

Figure 2:
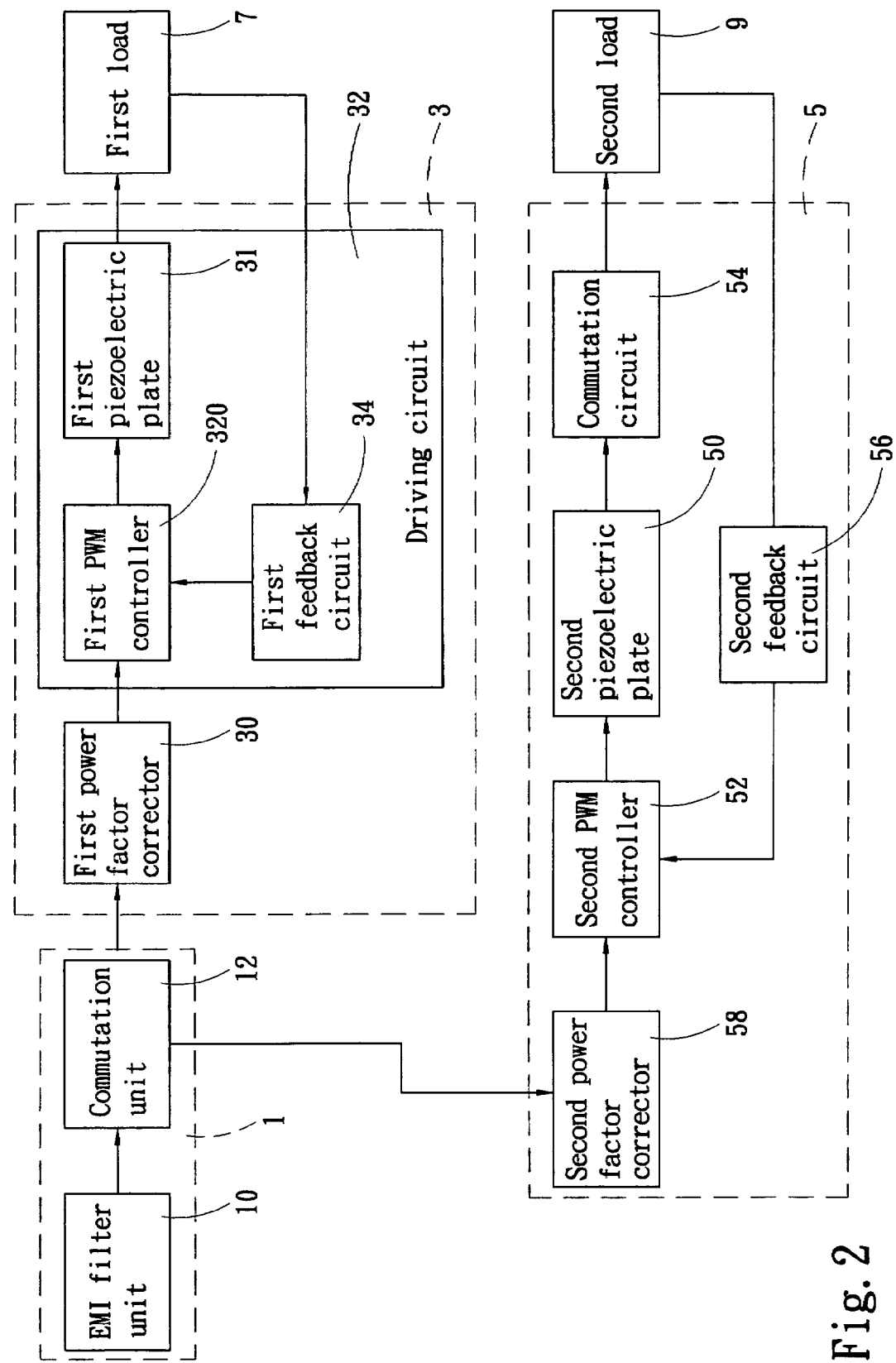
FIG. 2 is another architecture block diagram of the first embodiment of the invention.

Refer to FIG. 2 for another architecture block diagram of the first embodiment of the invention. The power supply unit 1 includes an electromagnetic interference (EMI) filter unit 10 and a commutation unit 12 to filer and rectify the city AC power to DC power to be output. And an isolation circuit (not shown in the drawings) may be included to isolate a power input end and a power output end. The commutation unit 12 may be a bridge type rectifier consisting of diodes.

The high voltage output unit 3 includes a first power factor corrector 30, the first piezoelectric plate (PZT) 31 and a driving circuit 32. The first power factor corrector 30 may be formed according to environmental regulations of each country. The driving circuit 32 includes a first pulse wave modulation (PWM) controller 320 and a first feedback circuit 34 to regulate power condition output to the first load 7.

The low voltage output unit 5 includes the second piezoelectric plate 50 and a second PWM controller 52 to provide low voltage AC power to the second load 9. The second piezoelectric plate 50 may be electrically connected to a commutation circuit 54 to provide low voltage DC power to the second load 9. The second PWM controller 52 may be electrically connected to a second feedback circuit 56 to regulate power condition output to the second load 9. The second PWM controller 52 has a power input front end which is electrically connected to a second power factor corrector 58 which is formed according to the environmental regulations of each country. The commutation circuit 54 may also be electrically connected to the first PWM controller 320 to provide required low voltage DC power.

It is to be noted that in the embodiment set forth above, the high voltage output unit 3 and the low voltage output unit 5 have respectively a first power factor corrector 30 and a second power factor corrector 58. In practice, depending on user requirements the high voltage output unit 3 and the low voltage output unit 5 may include a plurality of power factor correctors to deliver output, or one power factor corrector for either the high voltage output unit 3 or the low voltage output unit 5.

Figure 3:
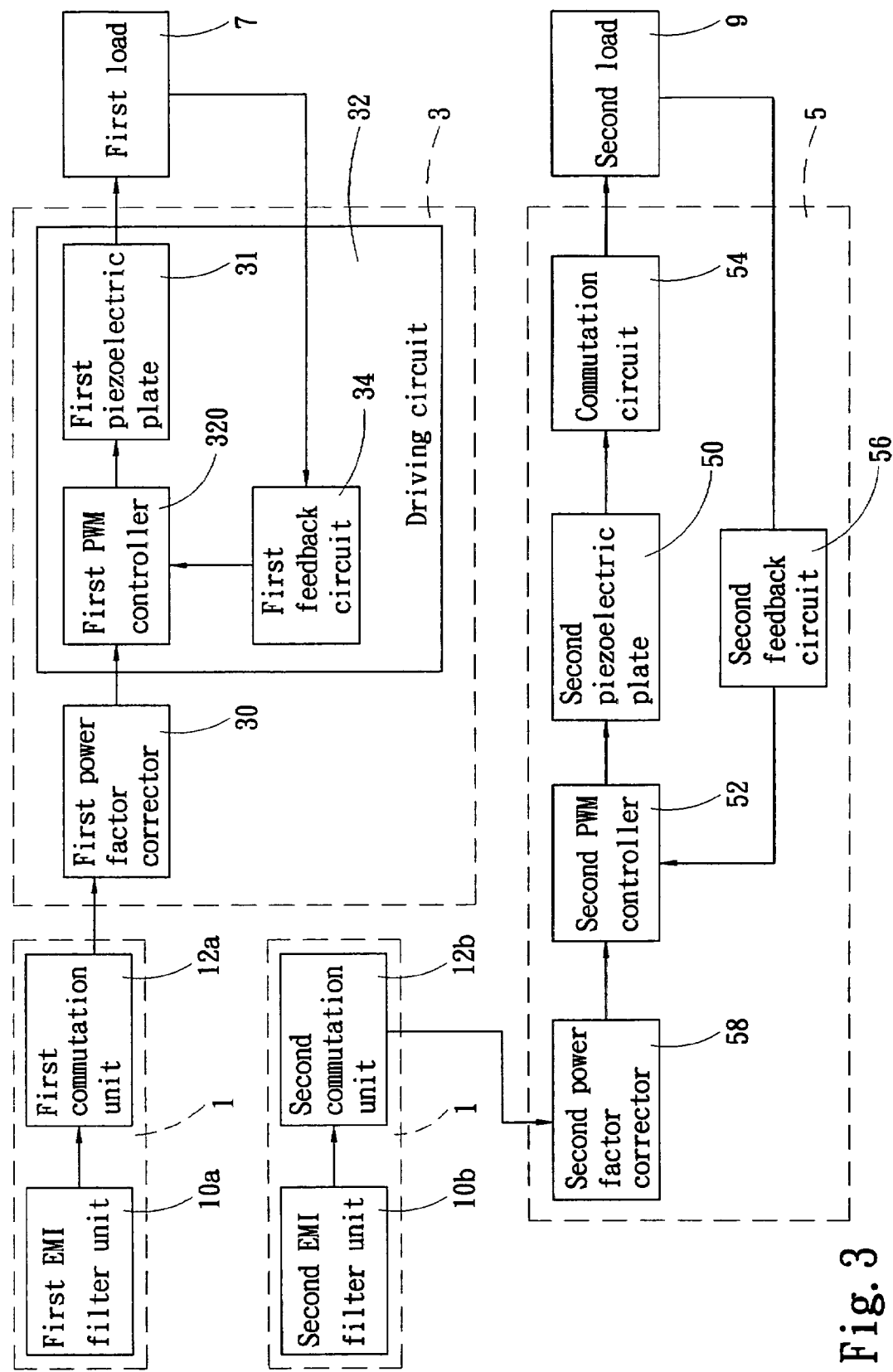
FIG. 3 is an architecture block diagram of a second embodiment of the invention.

Refer to FIG. 3 for an architecture block diagram of a second embodiment of the invention. It differs from the first embodiment by electrically connecting the high voltage output unit 3 to a first EMI filter unit 10a and a first commutation unit 12a, and electrically connecting the low voltage output unit 5 to a second EMI filter unit 10b and a second commutation unit 12b.

In short, the piezoelectric power supply of the invention has a high voltage output unit 3 equipped with a first piezoelectric plate 31 to supply power for a high voltage load such as a gas discharge lamp, and a low voltage output unit 5 equipped with a second piezoelectric plate 50 to supply power for low voltage peripheral devices. Hence high and low voltage power output can be integrated. It not only can reduce cost and production process of the high and low voltage power equipment, the competitiveness of manufacturers also can be enhanced. It offers a significant improvement over the conventional techniques.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A piezoelectric power supply to provide low voltage power and high voltage power, comprising:
    a power supply unit to provide output of DC intermediate voltage power;
    a high voltage output unit to transform the power output from the power supply unit through a first piezoelectric plate to AC high voltage power to be output; and
    a low voltage output unit to transform the power output from the power supply unit through a second piezoelectric plate to AC low voltage power to be output,
    wherein the power supply unit includes an electromagnetic interference (EMI) filter unlit and a commutation unit.

2. The piezoelectric power supply of claim 1, wherein the power supply unit receives city AC power.

3. The piezoelectric power supply of claim 1, wherein the power supply unit includes a first EMI filter unit, a first commutation unit, a second EMI filter unit and a second commutation unit, the first EMI filter unit and the first communication unit providing power for the high voltage output unit, the second EMI filter unit and the second commutation unit providing power for the low voltage output unit.

4. The piezoelectric power supply of claim 1, wherein the high voltage output unit includes at least one power factor corrector.

5. The piezoelectric power supply of claim 1, wherein the commutation unit is a bridge rectifier consisting of diodes.

6. A piezoelectric power supply to provide low voltage power and high voltage power, comprising:
    a power supply unit to provide output of DC intermediate voltage power;
    a high voltage output unit to transform the power output from the power supply unit through a first piezoelectric plate to AC high voltage power to be output; and
    a low voltage output unit to transform the power output from the power supply unit through a second piezoelectric plate to AC low voltage power to be output
    wherein the high voltage output unit includes a first pulse wave modulation (PWM) controller, the low voltage output unit being electrically connected to the first PWM controller to provide power for the first PWM controller.

7. A piezoelectric power supply to provide low voltage power and high voltage power, comprising:
    a power supply unit to provide output of DC intermediate voltage power;
    a high voltage output unit to transform the power output from the power supply unit through a first piezoelectric plate to AC high voltage power to be output; and
    a low voltage output unit to transform the power output from the power supply, unit through a second piezoelectric plate to AC low voltage power to be output,
    wherein the low voltage output unit includes at least one power factor corrector.

8. The piezoelectric power supply of claim 1, wherein the first piezoelectric plate is laminated piezoelectric plates.

9. The piezoelectric power supply of claim 1, wherein the first piezoelectric plate is a single piezoelectric plate.

10. The piezoelectric power supply of claim 1, wherein the second piezoelectric plate is laminated piezoelectric plates.

11. The piezoelectric power supply of claim 1, wherein the second piezoelectric plate is a single piezoelectric plate.

* * * * *